United States Patent
Wang et al.

(10) Patent No.: US 11,011,378 B2
(45) Date of Patent: May 18, 2021

(54) ATOM IMPLANTATION FOR REDUCTION OF COMPRESSIVE STRESS

(71) Applicant: Micron Technology, Inc., Boise, ID (US)

(72) Inventors: Yiping Wang, Boise, ID (US); Caizhi Xu, Boise, ID (US); Pengyuan Zheng, Boise, ID (US); Ying Rui, Meridian, ID (US); Russell A. Benson, Boise, ID (US); Yongjun J. Hu, Boise, ID (US); Jaydeb Goswami, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/459,079

(22) Filed: Jul. 1, 2019

(65) Prior Publication Data
US 2021/0005455 A1    Jan. 7, 2021

(51) Int. Cl.
*H01L 21/033* (2006.01)
*H01L 27/108* (2006.01)
*H01L 21/308* (2006.01)

(52) U.S. Cl.
CPC ...... *H01L 21/0337* (2013.01); *H01L 21/3086* (2013.01); *H01L 27/10808* (2013.01)

(58) Field of Classification Search
CPC ............. H01L 21/0337; H01L 21/3086; H01L 27/10808
USPC ........................................................ 257/296
See application file for complete search history.

(56) References Cited

U.S. PATENT DOCUMENTS

| | | | |
|---|---|---|---|
| 7,662,693 B2 | 2/2010 | Bhattacharyya | |
| 7,875,529 B2 | 1/2011 | Forbes et al. | |
| 8,274,777 B2 | 9/2012 | Kiehlbauch | |
| 2012/0070971 A1* | 3/2012 | Yeong | H01L 21/823864 438/558 |
| 2013/0249012 A1* | 9/2013 | Xu | H04L 21/02 257/369 |
| 2015/0087104 A1* | 3/2015 | Tseng | H01L 27/14625 438/70 |
| 2019/0172714 A1* | 6/2019 | Bobek | C23C 16/505 |

* cited by examiner

*Primary Examiner* — Dzung Tran
(74) *Attorney, Agent, or Firm* — Brooks, Cameron & Huebsch, PLLC (57) ABSTRACT

Systems, apparatuses, and methods related to atom implantation for reduction of compressive stress are described. An example method may include patterning a working surface of a semiconductor, the working surface having a hard mask material formed over a dielectric material and forming a material having a lower refractive index (RI), relative to a RI of the hard mask material, over the hard mask material. The method may further include implanting atoms through the lower RI material and into the hard mask material to reduce the compressive stress in the hard mask material.

8 Claims, 6 Drawing Sheets

ATOM IMPLANTATION FOR REDUCTION OF COMPRESSIVE STRESS

TECHNICAL FIELD

The present disclosure relates generally to semiconductor devices and methods, and more particularly to atom implantation for reduction of compressive stress (e.g., in material of a semiconductor device).

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells. Such types of memory, and components associated therewith, may be formed using elevated temperatures that may apply stress to the components.

DETAILED DESCRIPTION

Various types of memory devices may have conductive pathways to enable access to various components. The conductive pathways may include electrodes, access lines (e.g., word lines), and sense lines (e.g., bit lines), among other possible conductive pathways. The components accessible via the conductive pathways may include control circuitry, sense amplifiers, memory cells, transistors, and memory storage nodes (e.g., capacitors), among other possible components.

Among the various possible components of memory devices is, in a number of embodiments, a sense line to enable conductive contact between a storage node and a respective access device for determination of a charge level (e.g., a stored data value) on the storage node. Such a sense line may be formed as a pillar. In a number of embodiments, the sense line pillars may be formed as, or become through performance of various processes in a fabrication sequence, separate columns of stacked semiconductor materials having round, square, oblong, etc., cross-sections and that may each extend substantially vertically from a substrate on which they are positioned. Openings adjacent such pillars may be created by spacing preformed pillars at a predetermined distance from each other on the substrate or by forming (e.g., etching) the pillars from a stack of materials on the substrate at a predetermined distance from each other. Alternatively, pillars may be formed as separate walls of stacked semiconductor materials that may each extend substantially vertically from a substrate on which they are positioned or have been formed. The openings adjacent such pillars may be created by spacing the walls at a predetermined distance from each other on the substrate so as to form substantially rectilinear trenches between the pillars. The openings may contribute to isolation of sense line pillars from each other.

As used herein, "pillar material" is intended to include various materials (e.g., elements or compounds) that may be formed as, or in, one or more layers to form a pillar. For example, a sense line pillar may have a conductive material (e.g., tungsten, copper, silver, etc.) of the conductive pathway formed as part of (e.g., within) a pillar of semiconductor materials to enable sensing (detection) and/or transmission of a charge and/or current. In a number of embodiments, as described herein, a sense line pillar may be formed to have a hard mask material positioned over (e.g., formed on) a dielectric material. A material having a lower refractive index (RI), relative to a RI of the hard mask material, may be positioned over (e.g., deposited as a layer on) the hard mask material. The lower RI material may be used as an anti-reflection coating (ARC) during, or at, various points of the fabrication sequence processing. The lower RI material may be formed over the hard mask material at a high temperature (e.g., 350 degrees Celsius (° C.) to 450° C.) relative to a temperature (e.g., ambient temperature) of the underlying hard mask material. The high temperature of the lower RI material may contribute to (e.g., cause) a compressive stress in the underlying hard mask material.

During or after formation of the pillars (e.g., by etching through the pillar materials), the compressive stress in the hard mask material may contribute to (e.g., increase a probability of) unintended consequences. Such unintended consequences may, for example, include an unintended bend of the pillar relative to the substrate and opening (e.g., not extending substantially vertically from the substrate based on one or more bends in the pillar) and/or an increased probability of roughness (e.g., line width roughness (LWR) and/or space width roughness (SWR)) formed on a sidewall of the pillar. The unintended bend of the pillar and/or the roughness formed on the sidewall of the pillar may contribute to failure (e.g., a short circuit fault) of the pillar. The higher the height to width aspect ratio (AR) of the pillar, the higher the probability may be of unmitigated compressive stress in the hard mask material resulting in the unintended bend and/or roughness contributing to failure of the pillar.

As described herein, a number of types of atoms and/or ions may be implanted through the lower RI material and into the hard mask material to reduce the compressive stress in the hard mask material. The compressive stress described herein is intended to mean a ratio of stress (force per unit area) to displacement strength of the atoms that form the hard mask material. The compressive stress may be approximated as Young's modulus that measures a stiffness of a solid material. In the present disclosure, the compressive stress, or Young's modulus, may be expressed (measured) in megapascals (1 MPa=1 newton/square millimeter). Implantation of the atoms and/or ions into the hard mask material may loosen distortion of bonds caused by the compressive stress (e.g., by lowering the MPa value) such that the bonds more closely approximate their uncompressed three-dimensional (3D) structure.

As such, implantation of the types of atoms and/or ions described herein may reduce the level of compressive stress and, hence, the probability of compressive stress in the hard mask material contributing to an unintended bend of the pillar or roughness on the sidewall thereof. This may contribute to reduction of a probability of failure of the pillar, among reduction of probabilities other possible unintended consequences of processing the semiconductor device.

The present disclosure includes systems, apparatuses, and methods related to such atom implantation for reduction of compressive stress. An example of a method described herein includes patterning a working surface of a semiconductor, the working surface having a hard mask material formed over (e.g., on) a dielectric material and forming a material having a lower RI, relative to a RI of the hard mask material, over (e.g., on) the hard mask material. The method may further include implanting atoms through the lower RI material and into the hard mask material to reduce the compressive stress in the hard mask material.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the figure number of the drawing and the remaining digits identify an element or component in the drawing. Similar elements or components between different figures may be identified by the use of similar digits. For example, 105 may reference element "05" in FIG. 1A, and a similar element may be referenced as 105 in FIG. 1B. In some instances, a plurality of similar, but functionally and/or structurally distinguishable, elements or components in the same figure or in different figures may be referenced sequentially with the same element number (e.g., 106-1 and 106-2 in FIG. 1B).

Figure 1A:
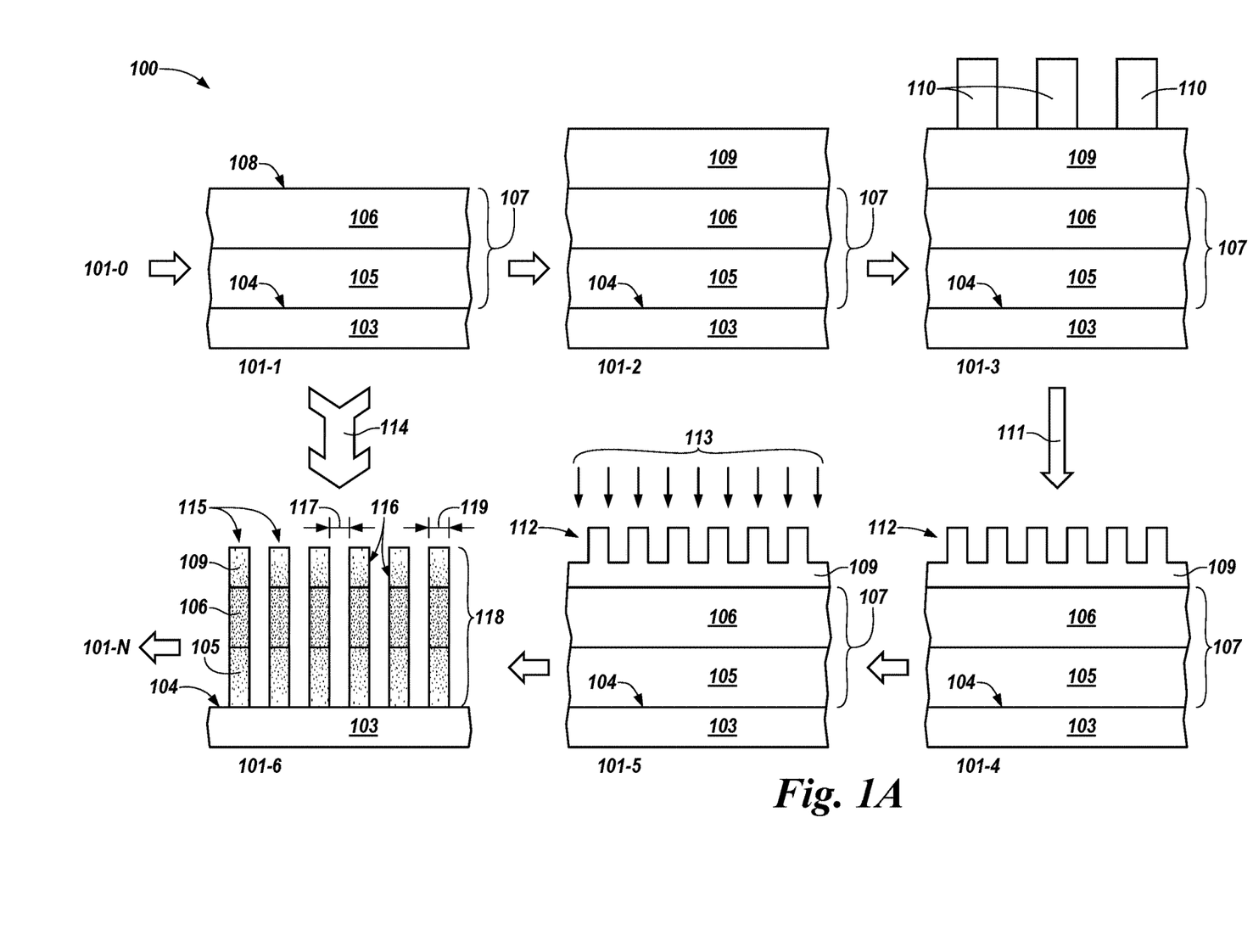
FIG. 1A illustrates a cross-sectional view of a portion of an example memory device at various points in time in an example fabrication sequence of using atom implantation for reduction of compressive stress in accordance with a number of embodiments of the present disclosure.

FIG. 1A illustrates a cross-sectional view of a portion of an example memory device at various points in time in an example fabrication sequence 100 of using atom implantation for reduction of compressive stress. The memory devices described herein include the example memory devices shown at 669 and 775 and described in connection with FIG. 6 and FIG. 7, respectively, although embodiments are not intended to be limited to these types of memory devices.

The fabrication sequence 100 illustrated in FIG. 1A is shown at points 101 in time that correspond to processing activities being performed in the fabrication sequence 100 (e.g., by a system 550 for processing as shown and described in connection with FIG. 5). The points 101 illustrate the structural features after various processing activities have been performed along the fabrication sequence 100. The fabrication sequence 100 may include repetition of particular fabrication processing activities (steps) through a number of iterations (cycles). Other processing activities may have been omitted from FIG. 1A for simplicity. The illustrated processing activities may correspond to formation, removal, and implantation of structural features.

As shown at point 101-1, formation of structural features may, for example, include formation (e.g., deposition) of a dielectric material 105 over (e.g., on) a surface 104 of a substrate 103. The dielectric material 105 may, in a number of embodiments, be a silicon nitride ($Si_xN_y$) material (e.g., silicon mononitride (SiN), silicon sesquinitride ($Si_2N_3$), and/or trisilicontetranitride ($Si_3N_4$)), although embodiments of the dielectric material are not so limited. The substrate 103 over which the dielectric material 105 is formed may a substrate appropriate for support of pillars (e.g., pillars 115 shown at point 101-6). As such, the substrate 103 may be formed from or include, for example, a doped or undoped monocrystalline silicon (monosilicon), polycrystalline silicon (polysilicon), and amorphous silicon, among other possibilities. Formation of the various materials described herein (e.g., as sequential layers thereof over the substrate 103) may be performed using appropriate wet or dry deposition processes (e.g., chemical vapor deposition (CVD), plasma deposition, etc.). The various materials may be patterned using these deposition processes and/or by removal of particular portions of the materials (e.g., using photolithographic techniques, doped and etched using vapor, wet and/or dry etch processes) to form semiconductor structures on the substrate 103.

The points 101 in time illustrated in FIG. 1A begin at point 101-0. Point 101-0 may encompass processing activities (not shown) in the fabrication sequence 100 performed prior to point 101-1. Point 101-1 in the fabrication sequence 100 includes forming a hard mask material 106 over (e.g., on) the dielectric material 105. The hard mask material 106 may be used as a mask that has a resistance to being etched by reactive gases, plasmas, and/or particles (e.g., oxygen, fluorine, chlorine, etc.) greater than a resistance of other "softer" materials that may be more rapidly removed (e.g., etched) during processing. The hard mask material 106 may include carbon (C) to contribute to the etch resistance. Hard mask material formed as such may, in a number of embodiments, be selected from a hemicellulose spin-on-carbon (SOC) hard mask, a fullerene SOC hard mask, or an amorphous C hard mask, among other possible types of C-containing hard mask materials. Hence, using a C-containing hard mask material includes forming the hard mask material 106 from substantially pure C, although embodiments are not so limited.

As used herein, the hard mask material 106 formed over the dielectric material 105 is, in combination, termed a working surface 107. The working surface 107 includes a top 108 over which other processing activities in the fabrication sequence 100 may be performed. For example, the processing activities shown at points 101-2, 101-3, 101-4, and 101-5, and at times not shown between these points, may be over or on the top 108 of the working surface 107. In contrast, forming the pillars 115 shown at point 101-6 may include etching through the working surface 107 (e.g., the hard mask material 106 and the dielectric material 105) to or into the substrate 103.

The fabrication sequence 100 illustrated in FIG. 1A shows at point 101-2 that a material 109 having a lower RI, relative to the RI of the hard mask material 106 of the working surface 107, is formed over the top 108 of the working surface 107. As such, the lower RI material 109 may be formed adjacent or in contact with the hard mask material 106. The lower RI material 109 may, in a umber of embodiments, be used (function) as an ARC above the working surface 107. The lower RI material 109 may, in a number of embodiments, be formed from nitrous oxide ($N_2O$) plasma or from $N_{20}$ gas and silane ($SiH_4$) at a temperature in a range of from around 350° C. to around 450° C., among other possible compounds and/or temperatures usable for formation of the lower RI material 109. Exposure of the hard mask material 106 of the working surface 107 to these elevated temperatures may increase the compressive stress in the hard mask material 106 relative a compressive stress level in the hard mask material 106 prior to formation of the lower RI material 109 on the top 108 of the working surface 107.

The fabrication sequence 100 illustrated in FIG. 1A shows at point 101-3 that a photoresist material 110 is formed in a pattern over (e.g., on) the lower RI material 109. At point 101-4, FIG. 1A shows that a portion of the lower RI material 109 has been removed (e.g., by using an etch process 111) consistent with the pattern to initiate formation 112 of a number of pillars of a semiconductor device (as shown completed at 115 at point 101-6). Initiation of the formation 112 of the pillars using the patterned photoresist material 110 may, in a number of embodiments, include multi-patterning (e.g., double patterning) to provide enough etch resolution to initiate formation of each of the pillars to meet intended critical dimensions (CDs) of a final structure or intermediary structures of a semiconductor (e.g., a memory device). For example, multi-patterning may be used to initiate formation of each of the pillars at a particular width (e.g., in a range of from around 50 Angstroms (A) to around 100 A) and/or to initiate formation of openings between each of the pillars at a particular width (e.g., in a range of from around 50 A to around 500 A).

Each pillar 115 may be formed to extend to a particular height 118 above an upper surface 104 of the substrate material 103. For example, as just described, a pillar 115 may be formed from a dielectric material 105, a hard mask material 106, and a lower RI material 109, among other possible materials and/or portions. Adjustment of a height of the various materials and/or portions may affect the height 118 of the pillar 115, as adjusting the width of the various materials and/or portions may affect the width 119 of the pillar 115. Variation in the height 118 and/or width 119 of the pillar 115 determine a particular AR of the pillar 115. The height 118 of a pillar 115 may correspond to a depth of an adjacent opening 117. A width by which each pillar 115 is separated from another pillar may define a width of the opening 117 between sidewalls 116 of the pillars 115. The sidewalls 116 of the pillars 115 may alternatively be termed sidewalls 116 of the opening 117, depending on the context.

Deposition and etching may be utilized to form the pillars 115 and the openings 117, etc. The height 118 and width 119 of the pillars 115, the width of the openings 117, and individual thicknesses, configurations, and/or compositions of the dielectric material 105, the hard mask material 106, and the lower RI material 109, among other possible materials (portions) of the pillars 115 (e.g., conductive materials) may vary according to an intended purpose, materials to be formed (e.g., deposited) therein, CDs, design rule specifications, etc.

The fabrication sequence 100 shows at point 101-5 that atoms 113 may be implanted through a remaining lower RI material 109 of the initiated formation of the pillars 112 and into the hard mask material 106 of the working surface 107. As described herein, the atoms may be implanted to reduce a probability of the unintended bend of, or roughness on, the pillar based on reduction of the compressive stress in the hard mask material 106 (e.g., resulting from or contributed to by formation of the lower RI material 109 at an elevated temperature thereon). Particular atoms 113 may be selected for implantation to reduce the compressive stress in the hard mask material 106. As described herein, atoms 113 of particular elements may be selected. The atoms 113 of the selected elements may, in a number of embodiments, include at least one of carbon (C) and arsenic (As) atoms, and various mixtures thereof. The atoms 113 that are selected may be implanted as neutral atoms, ionized atoms, or a mixture thereof.

The atoms 113 may be implanted from one or more sources (not shown) positioned above the remaining lower RI material 109. The source(s) may be a source of the atoms to be implanted and may include an accelerator to accelerate single atoms, ions, or molecules to an intended energy (velocity) toward the remaining lower RI material 109 and toward the underlying hard mask material 106 and dielectric material 105 of the working surface 107.

The atoms 113 may be preferentially implanted to an intended (e.g., selected) depth and/or an intended density. The number and/or density of atoms, for example, to be implanted into the hard mask material 106 may be predetermined to reduce the compressive stress in the hard mask material 106 to an intended level. A capability of achieving the preselected density of atoms implanted into the hard mask material 106 or a time period spent in doing so may be dependent upon an implant energy supplied by the source. When a particular dose of C atoms, for example, is selected to be implanted into the hard mask material 106 to a selected depth, a particular dose energy may be selected. For example, when C atoms are selected to be implanted through the remaining lower RI material 109 and into the hard mask material 106 at a dose in a range of from around $1\times10^{15}$ per square centimeter ($/cm^2$) to around $1\times10^{16}/cm^2$, the C atoms may be implanted using an implant energy in a range of from around 20 kiloelectron volts (keV) to around 40 keV. When the atoms to be implanted are other atoms (e.g., As), the keV and densities may be adjusted accordingly to reduce the compressive stress in the hard mask material 106 to an intended level, as described further herein.

The selected depth may, in a number of embodiments, be below the remaining lower RI material 109 and at and/or below the top 108 of the hard mask material 106. A particular depth below the top 108 of the hard mask material 106 to which the atoms 113 are able to be implanted may depend on the type of atom being implanted, the dose energy applied to the atoms, the composition of the RI material 109 and/or the hard mask material 106, and/or the relative ability of the elements or compounds in these materials 109, 106 to block or absorb penetration of the selected atoms, among other possibilities.

The fabrication sequence 100 shows at point 101-6 that a plurality of pillars 115 (e.g., walls, sense line pillars, among other possibilities) have been formed over (e.g., on) the surface 104 of the substrate 103. The pillars 115 may be formed by removal (e.g., using a selected etch process 114) of particular portions of the remaining lower RI material 109, the hard mask material 106, and the dielectric material 105. In a number of embodiments, the particular portions of the materials 109, 106, 105 may be removed to the surface 104 of the substrate 103 to form the pillars 115. The pillars 115 may be formed to a particular height 118 (e.g., above the surface 104 of the substrate 103) and a particular width 119. In a number of embodiments, the AR of the height 118 to the width 119 may be in a range of from around 20:1 to around 30:1. Accordingly, in embodiments in which the width 119 of the pillars 115 is in a range of from around 50 A to around 100 A, the height of the pillars 115 may be in a range of from around 1000 A to around 3000 A, although embodiments are not limited to these ARs, widths, and/or heights. The openings between sidewalls 116 of each of the pillars 115 may be formed at a particular width 117 (e.g., in a range of from around 50 A to around 500 A).

The atoms 113 shown and described as being implanted at point 101-5 are illustrated at point 101-6 as having an increased density (represented by increased stippling) in the hard mask material 106 portions of the pillars 115 than the densities of the atoms implanted into the lower RI material 109 and dielectric material 105 portions. Such a differential density of the implanted atoms 113 (e.g., C and/or As) may be consistent with (e.g., result from) a selected dose of the atoms and/or a selected implant energy. The differential density being greater in the hard mask material 106 may contribute to (e.g., enable) the reduction of the compressive stress in the hard mask material 106 to an intended level. The removal of the particular portions of the materials 109, 106, 105 to form the pillars 115 may contribute to or enable formation of a plurality of separate access lines, sense lines, or electrodes (e.g., as shown and described in connection with FIG. 7) for the semiconductor memory device based on other processing activities in the fabrication sequence 100 being performed at subsequent points 101-N in time.

Figure 1B:
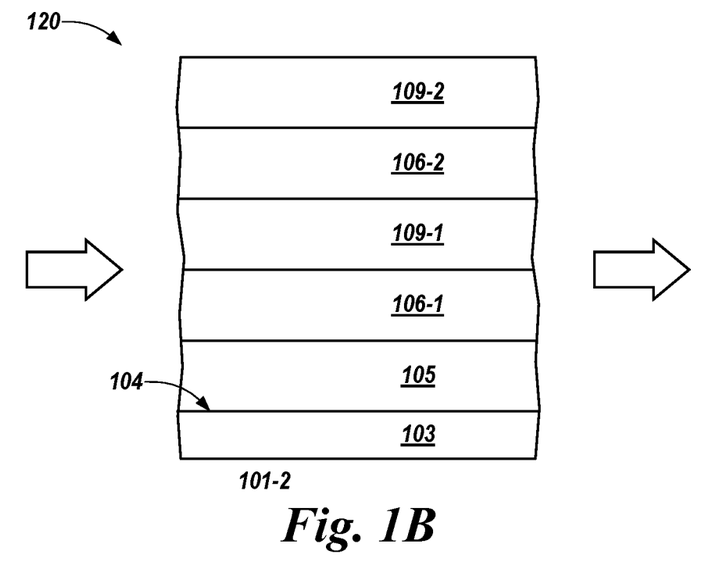
FIG. 1B illustrates a cross-sectional view of a portion of another example memory device at a particular point in time in another example fabrication sequence of using atom implantation for reduction of compressive stress in accordance with a number of embodiments of the present disclosure.

FIG. 1B illustrates a cross-sectional view of a portion of another example memory device at a particular point 101-2 in time in another example fabrication sequence 120 of using atom implantation for reduction of compressive stress. A lower RI material may be formed over (e.g., on) a hard mask material in a number of alternate embodiments. As shown and described in connection with point 101-2 in FIG. 1A, a single layer of lower RI material 109 may be formed (e.g., deposited) over a single layer of hard mask material 106.

In a first alternative fabrication sequence 120 at point 101-2, the working surface may be patterned to have a first hard mask material 106-1 formed over the dielectric material 105 followed by forming a first lower RI material 109-1, relative to a RI of the first hard mask material 106-1, over the first hard mask material 106-1. A second hard mask material 106-2 may be formed over the first lower RI material 109-1 and a second lower RI material 109-2, relative to a RI of the second hard mask material 106-2, 2 may be formed over the second hard mask material 106-2.

The thicknesses, configurations, and/or compositions of each of the dielectric material 105, the first hard mask material 106-1, the first lower RI material 109-1, the second hard mask material 106-2, the second lower RI material 109-2, among other possible portions (e.g., conductive materials) formed during the first alternative fabrication sequence 120 may vary according to an intended purpose, CDs, design rule specifications, etc. Accordingly, in a number of embodiments, the first hard mask material 106-1 may be formed to have a same or a different thickness, configuration, and/or composition relative to the second hard mask material 106-2. Similarly, the first lower RI material 109-1 may be formed to have a same or a different thickness, configuration, and/or composition relative to the second lower RI material 109-2. A number (quantity) of layers of the hard mask material 106 and the lower RI material 109 each may be three or more in a number of embodiments. In addition, a number of the layers of the hard mask material 106 may be the same as or different from a number of the layers of the lower RI material 109.

In the first alternative fabrication sequence 120, the atoms 113 shown and described in connection with point 101-5 in FIG. 1A, may be implanted through the first and second lower RI materials 109-1, 109-2 and into the first and second hard mask materials 106-1, 106-2 to reduce the compressive stress in the first and second hard mask materials. The atoms 113 may be implanted from the source (not shown) positioned above the remaining second lower RI material 109-2. The atoms 113 may be preferentially implanted to an intended (e.g., selected) depth and/or an intended density in the first hard mask material 106-1 and/or in the second hard mask material 106-2. The number and/or density of atoms, for example, to be implanted into each of the hard mask materials 106-1, 106-2 may be predetermined to reduce the compressive stress in the hard mask materials 106-1, 106-2 to an intended level. A capability of achieving the preselected density of atoms implanted into the hard mask materials 106-1, 106-2 or a time period spent in doing so may be dependent upon an implant energy supplied by the source. Depending on the atoms 113 (e.g., C, As, among other selected atoms) and a selected depth at which a peak dose (density) is intended, the keV, the time period, and/or the number of atoms, ions, or mixtures thereof accelerated per second from the source may be adjusted accordingly to reduce the compressive stress in the hard mask materials 106-1, 106-2 to the intended level.

In a second alternative fabrication sequence (not shown), the atoms 113 may be implanted through a first lower RI material formed over (e.g., on) a second lower RI material and into, for example, a single hard mask material over (e.g., on) which the second lower RI material is formed, although embodiments are not limited only to a single hard mask material. The first lower RI material may be formed to have a same or a different thickness, configuration, and/or composition relative to the second lower RI material. For example, in a number of embodiments, the first and second lower RI materials may be formed from the same material or the first lower RI material may be formed from $N_2O$ plasma and the second lower RI material may be formed from $N_2O$ gas and $SiH_4$, although embodiments are not so limited. A number (quantity) of layers of the lower RI material may be three or more in a number of embodiments. In addition, a number of the layers of the hard mask material may be the same as or different from a number of the layers of the lower RI material.

The atoms 113 may be implanted from the source positioned above the remaining second lower RI material. The atoms 113 may be preferentially implanted to an intended (e.g., selected) depth and/or an intended density in the underlying hard mask material. The number and/or density of atoms, for example, to be implanted into the underlying hard mask material may be predetermined to reduce the compressive stress in the hard mask material to an intended level. A capability of achieving the preselected density of atoms implanted into the hard mask material or a time period spent in doing so may be dependent upon an implant energy supplied by the source. Depending on the atoms 113 and a selected depth at which a peak dose (density) is intended, the keV, the time period, and/or the number of atoms, ions, or mixtures thereof accelerated per second from the source may be adjusted accordingly to reduce the compressive stress in the hard mask material to the intended level.

In a third alternative fabrication sequence (not shown), the atoms 113 may be implanted directly into a hard mask material, which does not have a lower RI material formed thereon, to reduce compressive stress in the hard mask material. In such an alternative fabrication sequence, the lower RI material is formed over (e.g., on) the hard mask material subsequent to implantation of the atoms 113 to reduce compressive stress in the hard mask material.

However, the elevated temperature (e.g., 350-450° C.) of the lower RI material that is formed (e.g., deposited) over the hard mask material may raise the level of the compressive stress in the hard mask material so as to at least partially reverse the preceding reduction resulting from (e.g., caused by) implantation of the atoms 113 into the hard mask material. Hence, implantation of the atoms 113 into the hard mask material subsequent to the lower RI material being formed thereon (as described in the fabrication sequence in connection with FIGS. 1A and 1n the first and second alternative fabrication sequences in connection with FIG. 1B) is more effective at reducing the compressive stress in the hard mask material than using the third alternative fabrication sequence just described.

Figure 2:
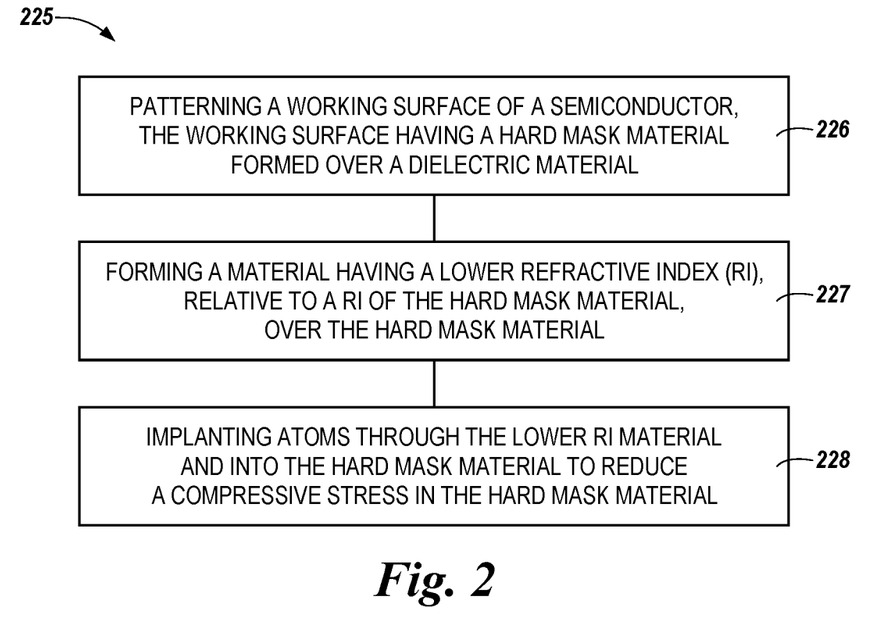
FIG. 2 is a flow diagram of an example method for using atom implantation for reduction of compressive stress in accordance with a number of embodiments of the present disclosure.

FIG. 2 is a flow diagram of an example method 225 for using atom implantation for reduction of compressive stress in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 226, the method 225 may include patterning a working surface of a semiconductor, the working surface having a hard mask material formed over (e.g., on) a dielectric material (e.g., as described in connection with point 101-1 in FIG. 1A). At block 227, the method 225 may include forming a material having a lower RI, relative to a RI of the hard mask material, over (e.g., on) the hard mask material (e.g., as described in connection with point 101-2 in FIGS. 1A and 1n FIG. 1B). At block 228, the method 225 may include implanting atoms through the lower RI material and into the hard mask material to reduce a compressive stress in the hard mask material (e.g., as described in connection with point 101-5 in FIG. 1A).

The method 225 may, in a number of embodiments, further include forming the lower RI material over the hard mask material prior to implanting the atoms, where the lower RI material is a last material formed over the hard mask material at a temperature greater than 100° C. As such, the lower RI material will not be formed (e.g., at 350-450° C.), nor will any other material be formed at a temperature greater than 100° C., over the hard mask material subsequent to implanting the atoms into the hard mask material. Hence, no such material may be formed at a temperature that at least partially reverses the preceding reduction of the compressive stress in the hard mask material (e.g., as described in connection with point 101-2 in FIG. 1B).

The method 225 may further include forming a photoresist material in a pattern over the lower RI material and removing a portion of the lower RI material consistent with the pattern to initiate formation of a pillar of a semiconductor device (e.g., as described in connection with point 101-4 in FIG. 1A). The atoms may be implanted through a remaining lower RI material and into the hard mask material to reduce a probability of an unintended bend of the pillar based on the reduced compressive stress in the hard mask material (e.g., as described in connection with point 101-5 in FIG. 1A). The method 225 may further include, alternatively or in addition to reducing the probability of the unintended bend, reducing a potential level of LWR on the pillar and/or reducing a potential level of SWR between the pillar and an adjacent pillar.

The method 225 may further include performing an etch process through the lower RI material, the hard mask material, and the dielectric material to form a pillar of a semiconductor device (e.g., as described in connection with point 101-6 in FIG. 1A). The pillar may be formed to have an AR in a range of from around 20:1 to around 30:1. The method 225 may further include reducing a probability of an unintended bend and/or roughness of the pillar relative to a pillar having an AR in the 20:1 to 30:1 range that does not include the atoms implanted through the lower RI material and into the hard mask material to reduce the compressive stress in the hard mask material.

The method 225 may further include patterning the working surface of the semiconductor to have a first hard mask material formed over the dielectric material and forming a first lower RI material, relative to a RI of the first hard mask material, over the first hard mask material. The method 225 may further include forming a second hard mask material over the first lower RI material and forming a second lower RI material, relative to a RI of the second hard mask material, over the second hard mask material (e.g., as described in connection with point 101-2 in FIG. 1B). Implanting the atoms through the first and second lower RI materials and into the first and second hard mask materials may reduce the compressive stress in the first and second hard mask materials.

The method 225 may further include forming the pillar as a sense line pillar to enable conductive contact with a data storage node of a semiconductor device. At least a portion of a memory device may be formed by the method 225. Such a memory device may be formed consistent with the memory devices shown at 669 and 775 and described in connection with FIG. 6 and FIG. 7, respectively, although embodiments are not intended to be limited to these types of memory devices. The memory device may have a memory cell structure that includes a sense line pillar (e.g., as shown at 715 and described in connection with FIG. 7) comprising the dielectric material, the hard mask material, the lower RI material, and the implanted atoms (e.g., as described in connection with point 101-6 in FIG. 1A). In a number of embodiments, the sense line pillar also may include a conductive material. The memory cell structure also may include a capacitor, as a data storage node (e.g., as shown at 790 and described in connection with FIG. 7), in conductive contact with the conductive material of the sense line pillar. The memory cell structure also may include an access device (e.g., as shown at 786, 787 and described in connection with FIG. 7) in conductive contact with the conductive material of the sense line pillar.

Figure 3:
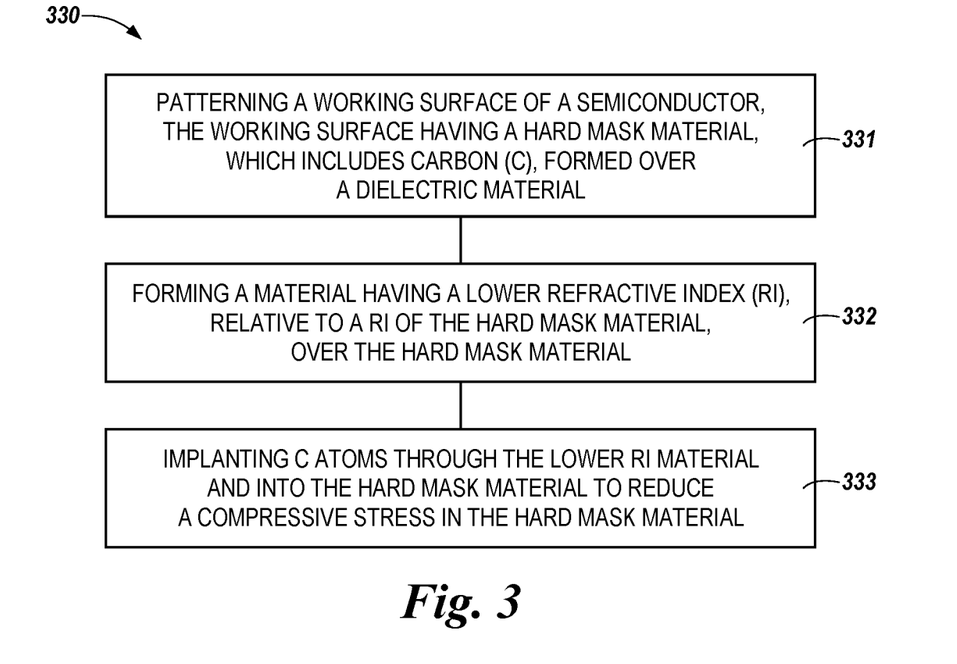
FIG. 3 is a flow diagram of another example method for using atom implantation for reduction of compressive stress in accordance with a number of embodiments of the present disclosure.

FIG. 3 is a flow diagram of another example method 330 for using atom implantation for reduction of compressive stress in accordance with a number of embodiments of the present disclosure. At block 331, the method 330 may include patterning a working surface of a semiconductor, the working surface having a hard mask material, which includes C, formed over (e.g., on) a dielectric material (e.g., as described in connection with point 101-1 in FIG. 1A). At block 332, the method 330 may include forming a material having a lower RI, relative to a RI of the hard mask material, over (e.g., on) the hard mask material (e.g., as described in connection with point 101-2 in FIGS. 1A and 1n FIG. 1B). At block 333, the method 330 may include implanting C atoms through the lower RI material and into the hard mask material to reduce a compressive stress in the hard mask material (e.g., as described in connection with point 101-5 in FIG. 1A).

The method 330 may further include increasing the compressive stress in the hard mask material by formation of the lower RI material over the hard mask material at a temperature of at least 200° C. For example, in a number of embodiments, the lower RI material may be formed over the hard mask material at a temperature in a range of 350-450° C., which may increase the compressive stress in the hard mask material. The compressive stress in the hard mask material may be increased (e.g., from substantially 0 MPa prior to formation of the lower RI material thereon) to at least 150 MPa by formation of the lower RI material over the hard mask material. The compressive stress has increased to 300-1000 MPa by formation of the lower RI material over the hard mask material during implementation of some fabrication sequences.

The method 330 may further include subsequently reducing the increased compressive stress in the hard mask material by the C atoms being implanted through the lower RI material and into the hard mask material subsequent to formation of the lower RI material thereon. The compressive stress in the hard mask material may be reduced (e.g., from the at least 150 MPa) to below 25 MPa by the C atoms being implanted into the hard mask material. The compressive stress has decreased to substantially 0 MPa by the C atoms being implanted into the hard mask material subsequent to formation of the lower RI material thereon during implementation of some fabrication sequences.

The method 330 may further include forming a pillar of a semiconductor device from the lower RI material, the hard mask material, and the dielectric material (e.g., as described in connection with point 101-6 in FIG. 1A). A probability of an unintended bend, LWR, and/or SWR of the pillar may be reduced by implantation of the C atoms to reduce the compressive stress in the hard mask material subsequent to formation of the lower RI material over the hard mask material. The reduced probability may be determined relative to the C atoms being implanted into the hard mask material prior to formation of the lower RI material over the hard mask material (e.g., as described in connection with FIG. 1B). For example, forming the lower RI material over the hard mask material subsequent to the C atoms being implanted into the hard mask material may increase the compressive stress in the C-implanted hard mask material (e.g., to a MPa level that may approach a MPa level resulting from formation the lower RI material over the hard mask material when no C atoms have been implanted therein).

The method 330 may, in a number of embodiments, further include implanting the C atoms into the hard mask material at an intended dose in a range of from around $1\times10^{15}/cm^2$ to around $1\times10^{16}/cm^2$ (e.g., as described in connection with point 101-5 in FIG. 1A). The method 330 may, in a number of embodiments, further include implanting the C atoms through the lower RI material using an implant energy in a range of from around 5 keV to around 60 keV (e.g., to achieve the intended dose at a particular peak depth in the hard mask material). In some embodiments, the implant energy used for the C atoms may be in a range of from around 20 keV to around 40 keV.

Figure 4:
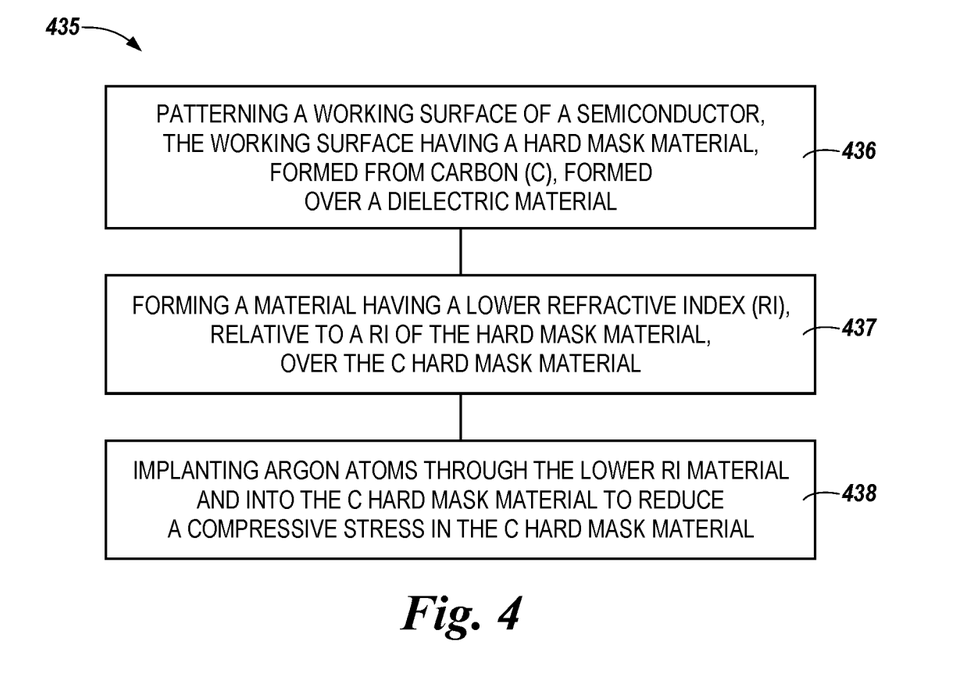
FIG. 4 is a flow diagram of another example method for using atom implantation for reduction of compressive stress in accordance with a number of embodiments of the present disclosure.

FIG. 4 is a flow diagram of another example method 435 for using atom implantation for reduction of compressive stress in accordance with a number of embodiments of the present disclosure. At block 436, the method 435 may include patterning a working surface of a semiconductor, the working surface having a hard mask material, formed from C (e.g., substantially pure C), formed over (e.g., on) a dielectric material (e.g., as described in connection with point 101-1 in FIG. 1A). At block 437, the method 435 may include forming a material having a lower RI, relative to a RI of the hard mask material, (e.g., on) the hard mask material (e.g., as described in connection with point 101-2 in FIGS. 1A and 1n FIG. 1B). At block 438, the method 435 may include implanting Ar atoms through the lower RI material and into the C hard mask material to reduce a compressive stress in the C hard mask material (e.g., as described in connection with point 101-5 in FIG. 1A).

The method 435 may further include forming a pillar of a semiconductor device from the lower RI material, the C hard mask material, and the dielectric material and increasing the compressive stress in the C hard mask material by formation of the lower RI material over the C hard mask material at a temperature of at least 200° C. The compressive stress in the hard mask material may be increased to at least 150 MPa by formation of the lower RI material over the hard mask material (e.g., as described in connection with method 330 and FIG. 3). The method 435 may further include subsequently reducing the increased compressive stress in the hard mask material by the Ar atoms being implanted into the C hard mask material (e.g., instead of the C atoms being implanted as described in connection with method 330 and FIG. 3).

The method 435 may further include subsequently reducing the increased compressive stress in the hard mask material by the Ar atoms being implanted through the lower RI material and into the hard mask material subsequent to formation of the lower RI material thereon. The compressive stress in the hard mask material may be reduced (e.g., from the at least 150 MPa) to below 25 MPa by the Ar atoms being implanted into the hard mask material. The compressive stress has decreased to substantially 0 MPa by the Ar atoms being implanted into the hard mask material subsequent to formation of the lower RI material thereon during implementation of some fabrication sequences.

A probability of an unintended bend, LWR, and/or SWR of the pillar may be reduced by implantation of the Ar atoms to reduce the compressive stress in the hard mask material subsequent to formation of the lower RI material over the hard mask material. The reduced probability may be determined relative to the Ar atoms being implanted into the hard mask material prior to formation of the lower RI material over the hard mask material (e.g., as described in connection with FIG. 1B and in connection with method 330 and FIG. 3).

The reduced probability of an unintended bend, LWR, and/or SWR of the pillar by the Ar atoms being implanted into the C hard mask material also may be determined relative to a probability of an unintended bend, LWR, and/or SWR when C atoms (instead of Ar atoms) are implanted into the C hard mask material at a dose of C atoms/cm$^2$ that is at least equal to a dose of Ar atoms/cm$^2$. For example, during implementation of some fabrication sequences, the compressive stress (e.g., that causes the unintended bend, LWR, and/or SWR of a pillar) is notably lower when the Ar atoms are implanted into the C hard mask material at a dose in a range of from around $1.0 \times 10^{14}$/cm$^2$ to around $1.0 \times 10^{15}$/cm$^2$, and, in a number of embodiments, at an implant energy in a range of from around 10 keV to around 60 keV, than when C atoms are implanted into the C hard mask material at a dose in a range of from around $1.0 \times 10^{15}$/cm$^2$ to around $1.0 \times 10^{16}$/cm$^2$ and an implant energy in a range of from around 5 keV to around 60 keV. In a number of embodiments, the implant energy used for the Ar atoms may be in a range of from around 50 keV to around 80 keV, whereas the implant energy used for the C atoms may be in a range of from around 20 keV to around 40 keV.

Accordingly. the method 435 may further include reducing a cost for semiconductor device processing by implanting a dose of the Ar atoms/cm$^2$ into the C hard mask material that is less than a dose of C atoms/cm$^2$ potentially implanted into the C hard mask material. Reducing the cost, by the lesser dose of Ar atoms being implanted, may be accomplished while also reducing a probability of an unintended bend, LWR, and/or SWR of a pillar to a level of a probability of an unintended bend, LWR, and/or SWR when the C atoms are implanted at a greater dose.

The method 435 may further include reducing a cost for semiconductor device processing by use of a higher implant energy to implant the Ar atoms into the C hard mask material than an implant energy potentially used to implant C atoms into the C hard mask material and implanting a dose of the Ar atoms/cm$^2$ in less time than is used to implant an at least equal dose of C atoms/cm$^2$. For example, during implementation of some fabrication sequences, a dose of the Ar atoms (e.g., $2.0 \times 10^{15}$ atoms/cm$^2$) may be implanted into the C hard mask material using 60 keV in approximately half the time of an equal dose being implanted into the C hard mask material using 30 keV.

In addition, a dose of the Ar atoms that is notably less than a dose of the C atoms reduces the compressive stress to a MPa level at least as low as achieved using a greater dose of the C atoms (e.g., $5.0 \times 10^{14}$ Ar atoms/cm$^2$ versus $2.0 \times 10^{15}$ C atoms/cm$^2$). Accordingly, a probability of an unintended bend, LWR, and/or SWR of a pillar may be reduced by the Ar atoms being implanted relative to a probability of an unintended bend, LWR, and/or SWR when the C atoms are implanted at a substantially equal dose.

Figure 5:
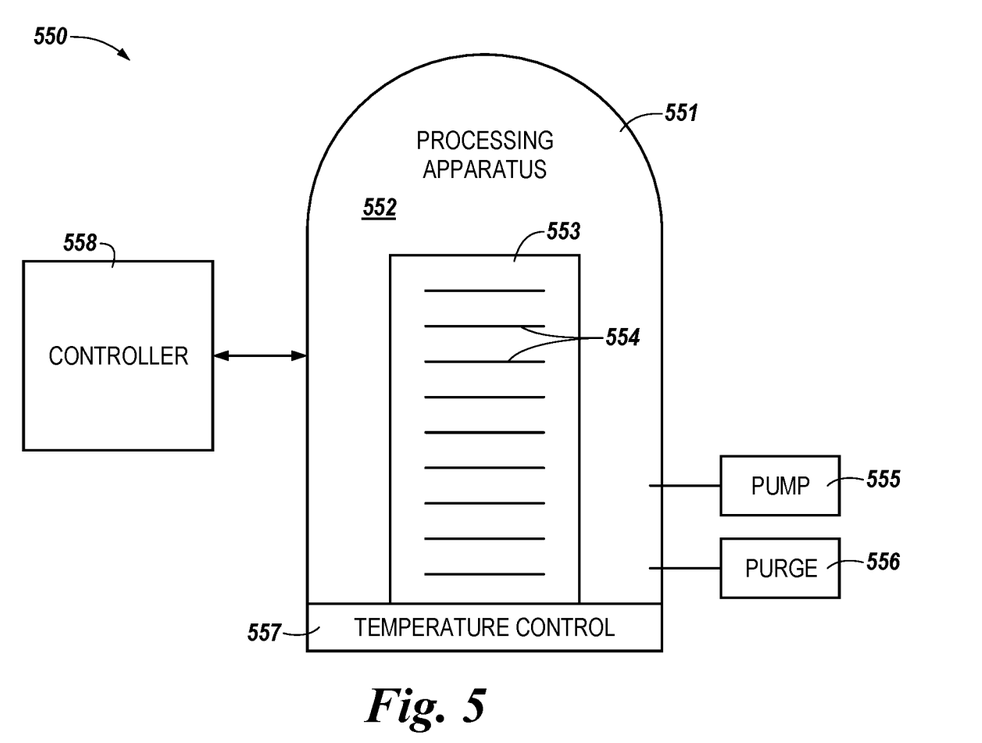
FIG. 5 is a functional block diagram of a system for implementation of an example semiconductor fabrication process in accordance with a number of embodiments of the present disclosure.

FIG. 5 is a functional block diagram of a system 550 for implementation of an example semiconductor fabrication process in accordance with a number of embodiments of the present disclosure. The system 550 may include a processing apparatus 551. The processing apparatus 551 may be configured to enable formation of structural materials on and/or removal of structural materials from a semiconductor device during fabrication of the semiconductor device.

The processing apparatus 551 may include a chamber 552 to enclose components configured to perform wet or dry deposition or etch operations, possibly in addition to other operations (e.g., by having a source for atom implantation operations), on a number of semiconductor devices (e.g., wafers on which memory devices 669, 775 or arrays 666 are being formed by the example semiconductor fabrication sequences described herein). The chamber 552 may further enclose a carrier 553 to hold a batch of semiconductor wafers 554. The processing apparatus 551 may include and/or be associated with tools including, for example, a pump 555 unit and a purge 556 unit configured to introduce and remove appropriate deposition chemistries and etch chemistries, or tools for performance of an atom implantation process, as described herein, at each point in the semiconductor fabrication sequence. The processing apparatus 551 may further include a temperature control 557 unit configured to maintain the chamber 552 at an appropriate temperature at each of the points in the fabrication sequences. For example, the temperature control 557 unit may be configured to bring the chamber 552 to a raised temperature appropriate for performance of some processes and to reduce the temperature as appropriate for performance of other processes (e.g., dry or wet deposition, etching, atom implantation, etc.). The system 550 may include a number of chambers 552 that are each configured to perform particular processes (e.g., a wet etch process, a dry etch process, a wet deposition process, a dry deposition process, a wet clean process, a dry clean process, an atom implantation process, among others) during the fabrication sequence.

The system 550 may further include a controller 558. The controller 558 may include, or be associated with, circuitry and/or programming for implementation of, for instance, formation and removal of materials, including deposition, etching, and/or atom implantation of various materials, related to reduction of compressive stress in a semiconductor device. Adjustment of such deposition, etching, and atom implantation operations by the controller 558 may control the CDs of the semiconductor devices created in the processing apparatus 551.

A host may be configured to generate instructions related to capacitance reduction in a semiconductor device. An example of a host is shown at 661 in FIG. 6, although embodiments are not limited to being coupled to the memory system 663 shown in FIG. 6. The instructions may be sent via a host interface 664 to the controller 558 of the processing apparatus 551. The instructions may be based at least in part on scaled preferences (e.g., in numerically and/or structurally defined gradients) stored by the host 661, provided via input from another storage system (not shown), and/or provided via input from a user (e.g., a human operator), among other possibilities. The controller 558 may be configured to enable input of the instructions and scaled preferences to define the CDs of the fabrication of the semiconductor device to be implemented by the processing apparatus 551.

The scaled preferences may determine final structures (e.g., the CDs) of the structural materials, conductive materials, insulating materials, semiconductor materials, substrate materials, dielectric materials, hard mask materials, lower RI materials, doses of implanted atoms, capacitor materials, memory devices, and/or memory cells, among the various other structural features described herein. Particular CDs may be enabled by the particular scaled preferences that are input via the instructions. Receipt and implementation of the scaled preferences by the controller 558 may result in corresponding adjustment, by the processing apparatus 551, of a deposition time for various materials, adjustment of a coverage area, height, and/or volume of the various materials, adjustment of an etch direction, adjustment of an etch time performed on the various materials, and/or adjustment of the temperature during the various processes, among implementation of other possible scaled preferences.

The controller 558 may, in a number of embodiments, be configured to use hardware as control circuitry. Such control circuitry may, for example, be an application specific integrated circuit (ASIC) with logic to control fabrication steps, via associated deposition, etch, and/or atom implantation processes, related to reduction of compressive stress in a semiconductor device, along with formation of the various materials on and removal of the various materials from the semiconductor device.

The controller 558 may be configured to receive the instructions and direct performance of operations, corresponding to the instructions, by the processing apparatus 551. The controller 558 may be configured to implement the instructions to control a quantity of the various materials that are formed on and removed from the semiconductor device.

Figure 6:
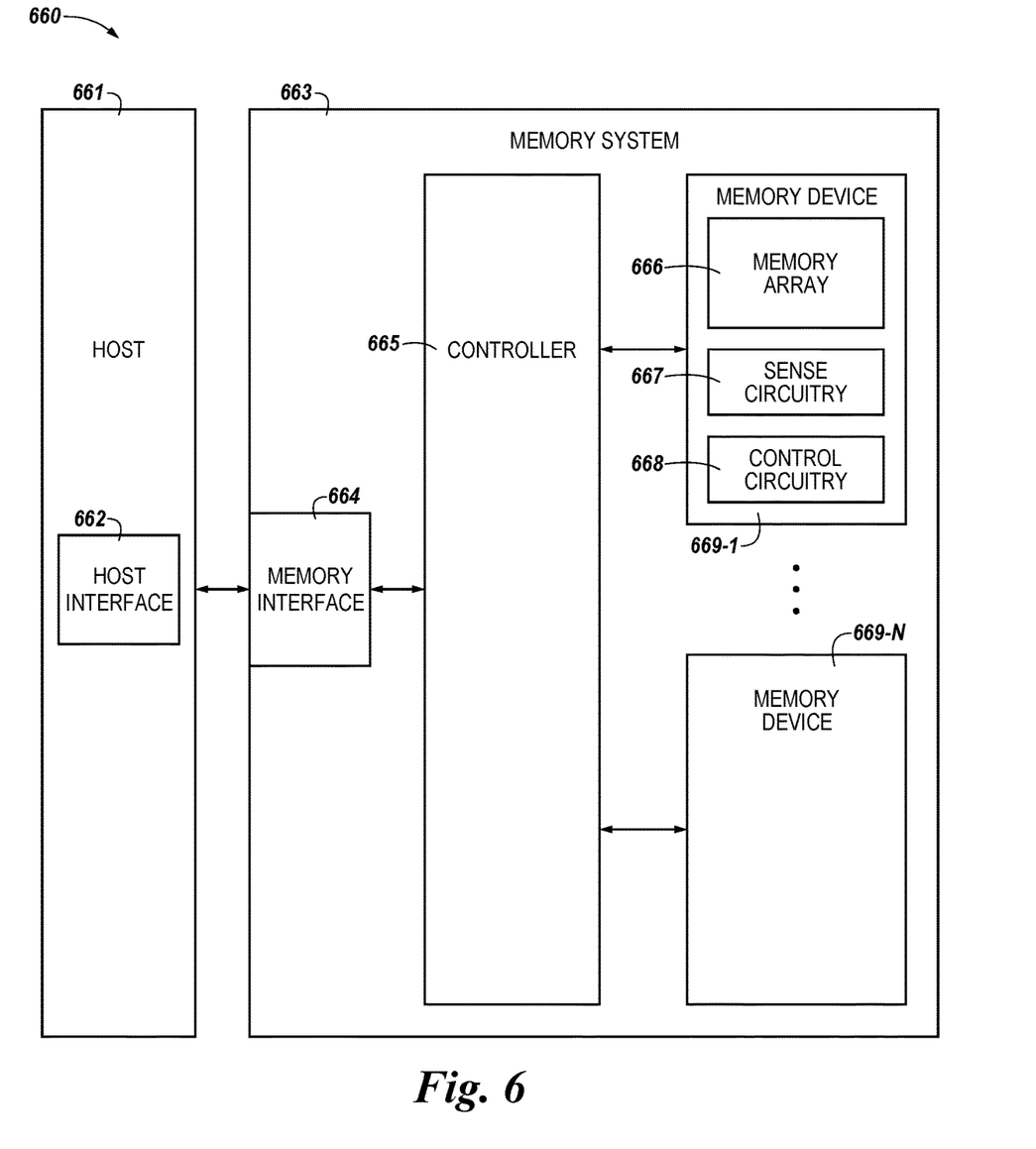
FIG. 6 is a functional block diagram of a computing system including at least one memory system in accordance with one or more embodiments of the present disclosure.

FIG. 6 is a functional block diagram of a computing system 660 including at least one memory system 663 in accordance with one or more embodiments of the present disclosure. Memory system 663 may be, for example, a solid-state drive (SSD).

In the embodiment illustrated in FIG. 6, memory system 663 includes a memory interface 664, a number of memory devices 669-1, . . . , 669-N, and a controller 665 selectably coupled to the memory interface 664 and memory devices 669-1, . . . , 669-N. Memory interface 664 may be used to communicate information between memory system 663 and another device, such as a host 661. Host 661 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host 661 may be associated with fabrication operations performed on semiconductor devices and/or SSDs using, for example, a processing apparatus.

Figure 7:
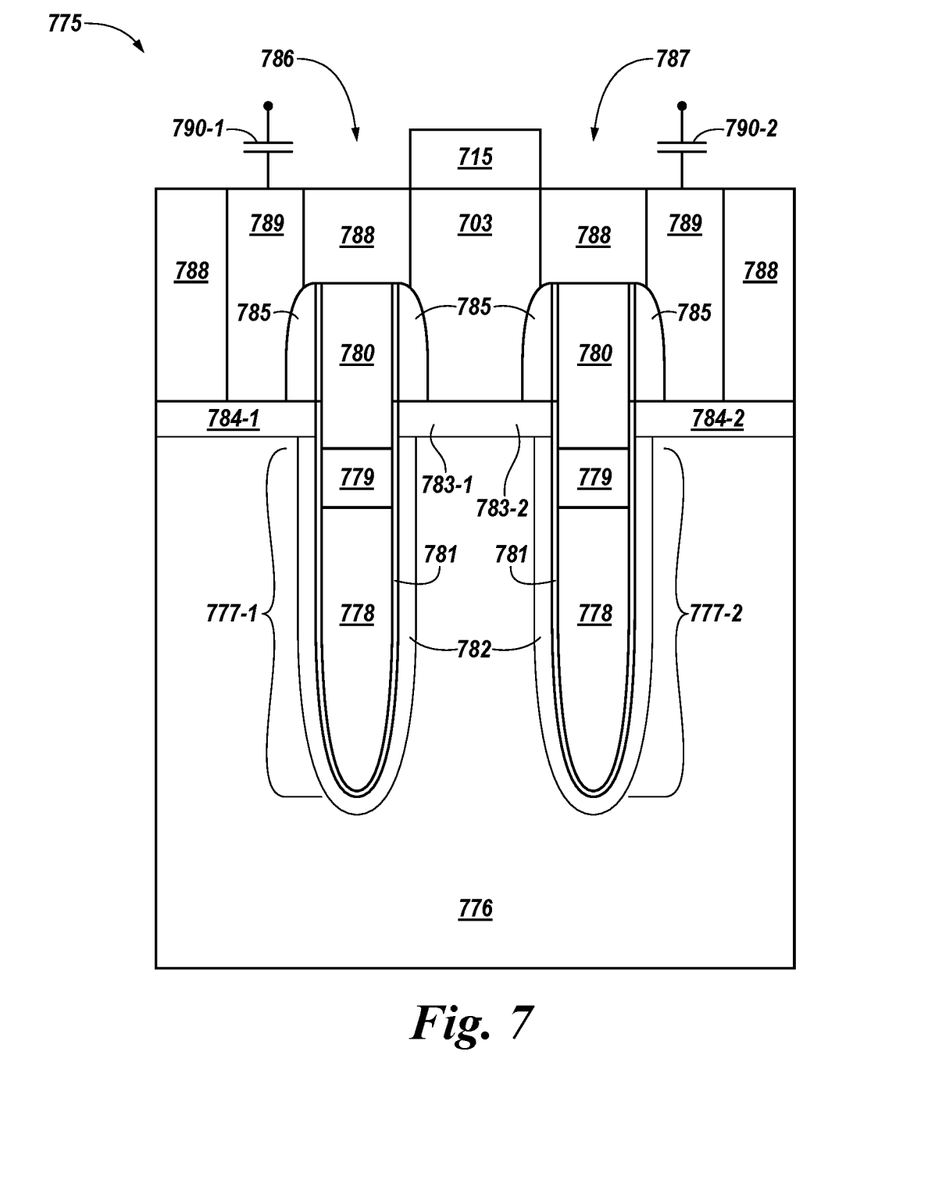
FIG. 7 illustrates an example cross-sectional view of a portion of a semiconductor memory device in accordance with a number of embodiments of the present disclosure.

In a number of embodiments, host 661 may be associated with (e.g., include or be coupled to) a host interface 662. The host interface 662 may enable input of scaled preferences (e.g., in numerically and/or structurally defined gradients) to define, for example, CDs of a final structure or intermediary structures of a memory device (e.g., as shown at 669 and/or 775) and/or an array of memory cells (e.g., as shown at 666) formed thereon. The scaled preferences may be provided to the host interface 662 via input of a number of preferences stored by the host 661, input of preferences from another storage system (not shown), and/or input of preferences by a user (e.g., a human operator).

Memory interface 664 may be in the form of a standardized physical interface. For example, when memory system 663 is used for information (e.g., data) storage in computing system 661, memory interface 664 may be a serial advanced technology attachment (SATA) interface, a peripheral component interconnect express (PCIe) interface, or a universal serial bus (USB) interface, among other physical connectors and/or interfaces. In general, however, memory interface 664 may provide an interface for passing control, address, information, scaled preferences, and/or other signals between the controller 665 of memory system 663 and a host 661 (e.g., via host interface 662).

Controller 665 may include, for example, firmware and/or control circuitry (e.g., hardware). Controller 665 may be operably coupled to and/or included on the same physical device (e.g., a die) as one or more of the memory devices 669-1, . . . , 669-N. For example, controller 665 may be, or may include, an ASIC as hardware operably coupled to circuitry (e.g., a printed circuit board) including memory interface 664 and memory devices 669-1, . . . , 669-N. Alternatively, controller 665 may be included on a separate physical device that is communicatively coupled to the physical device (e.g., the die) that includes one or more of the memory devices 669-1, . . . , 669-N.

Controller 665 may communicate with memory devices 669-1, . . . , 669-N to direct operations to sense (e.g., read), program (e.g., write), and/or erase information, among other functions and/or operations for management of memory cells. Controller 665 may have circuitry that may include a number of integrated circuits and/or discrete components. In a number of embodiments, the circuitry in controller 665 may include control circuitry for controlling access across memory devices 669-1, . . . , 669-N and/or circuitry for providing a translation layer between host 661 and memory system 663.

Memory devices 669-1, . . . , 669-N may include, for example, a number of memory arrays 666 (e.g., arrays of volatile and/or non-volatile memory cells). For instance, memory devices 669-1, . . . , 669-N may include arrays of memory cells, such as a portion of an example memory device 669, 775 structured to include access lines, sense lines, and electrodes described in connection with FIGS. 2, 6, and 7, respectively. As will be appreciated, the memory cells in the memory arrays 666 of memory devices 669-1, . . . , 669-N may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory devices 669, 775 may be formed on the same die. A memory device (e.g., memory device 669-1) may include one or more arrays 666 of memory cells formed on the die. A memory device may include sense circuitry 667 and control circuitry 668 associated with one or more arrays 666 formed on the die, or portions thereof. The sense circuitry 667 may be utilized to determine (sense) a particular data value (e.g., 0 or 1) that is stored at a particular storage node 262, 762 (e.g., memory cell) in a row of an array 666. The control circuitry 668 may be utilized to direct the sense circuitry 667 to sense particular data values, in addition to directing storage, erasure, etc., of data values in response to a command from host 661 and/or host interface 662. The command may be sent directly to the control circuitry 668 via the memory interface 664 or to the control circuitry 668 via the controller 665.

The embodiment illustrated in FIG. 6 may include additional circuitry that is not illustrated so as not to obscure embodiments of the present disclosure. For example, memory devices 669, 775 may include address circuitry to latch address signals provided over I/O connectors through I/O circuitry. Address signals may be received and decoded by a row decoder and a column decoder to access a memory array 666. It will be appreciated that the number of address input connectors may depend on the density and/or architecture of memory devices 669, 775 and/or memory arrays 666.

FIG. 7 illustrates an example cross-sectional view of a portion of a semiconductor memory device 775 in accordance with a number of embodiments of the present disclosure. FIG. 7 illustrates neighboring access devices 786 and 787 (e.g., memory cell transistors) as may be present in a memory array of a memory device such as shown in FIG. 6. In the example embodiment of FIG. 7, the neighboring access devices 786 and 787 are shown as buried recessed access devices (BRADs). Embodiments, however, are not limited to this example. In a semiconductor fabrication process, a gate dielectric 781 and semiconductor materials may be deposited to form access device gates 778 and 779 according to a particular BRAD design process. Embodiments are not limited to the example shown. In this example of neighboring BRAD devices 786 and 787, the access devices may be formed to a particular depth in gate areas 777-1 and 777-2 of substrate material 776.

As shown in FIG. 7, the gates 778, 779 are formed for the access devices 786 and 787. As shown, gate 778 may be a gate to a recessed access device (e.g., a BRAD). In the example shown, the gate 778 may include a gate material 778 including a metal (e.g., titanium nitride) and a gate material 779 including a doped polysilicon to form a hybrid metal gate. The gate 778 may be separated from a channel 782, separating a first source/drain region 784-1 and 784-2 (collectively or individually referred to as first source/drain region 784) and a second source/drain region 783-1 and 783-2 (collectively or individually referred to as second source/drain region 783) by a gate dielectric 781.

In the example of FIG. 7, the two neighboring access devices 786 and 787 are shown sharing a second source/drain region 783 at a junction. A sense line contact 703 may be formed of a metallic material, or of another conductive contact. The sense line contact 703 may be formed in contact with the second source/drain region 783 at the junction. A sense line pillar 715 (e.g., shown at 115 and described in connection with FIG. 1A and elsewhere herein) may be formed in contact with the sense line contact 703. A storage node contact 789 may be coupled to each first source/drain region 784, and a storage node 790-1, 790-2 may be coupled to the storage node contact 789. An insulation material 788 (e.g., a dielectric material) may be formed on spacer material 785 and mask material 780 to separate conductive storage node contacts 789.

In a number of embodiments, a portion of the sense line contact 703 may be formed in contact with spacer material 785, the second source/drain regions 783, and the junction. Insulation material 788 may be formed on the spacer material 785, the mask material 780, and in contact with a portion of the sense line contact 703 and storage node contacts 789. A gate dielectric 781 separates the gate 778 from the channel 782 for each of the neighboring BRAD devices 786 and 787 shown in the example memory device 775 of FIG. 7.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. Moreover, the structural features illustrated in the accompanying drawings are intended to indicate relative positioning of the structural features in one or more embodiments and are not necessarily drawn to scale relative to other structural features in the drawings or otherwise.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically for access to and/or for movement (transmission) of instructions (e.g., control signals, address signals, etc.) and data, as appropriate to the context.

While example embodiments including various combinations and configurations of structural materials, atoms to be implanted into the hard mask materials, semiconductor materials, substrate materials, hard mask materials, lower RI materials, pillar materials, conductive materials, dielectric materials, capacitor materials, memory devices, memory cells, pillars, openings, sidewalls of the pillars and/or openings, among other materials and/or components related to atom implantation for reduction of compressive stress in material of a semiconductor device, have been illustrated and described herein, embodiments of the present disclosure are not limited to those combinations explicitly recited herein. Other combinations and configurations of the structural materials, atoms to be implanted into the hard mask materials, semiconductor materials, substrate materials, hard mask materials, lower RI materials, pillar materials, conductive materials, dielectric materials, capacitor materials, memory devices, memory cells, pillars, openings, sidewalls of the pillars and/or openings, among other materials and/or components related to atom implantation for reduction of compressive stress than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:
1. A method, comprising:
   patterning a working surface of a semiconductor, the working surface having a hard mask material, which includes carbon (C), formed over a dielectric material;

forming a material having a lower refractive index (RI), relative to a RI of the hard mask material, over the hard mask material, wherein forming the material having the lower RI including formation of the lower RI material at a temperature of at least 200 degrees Celsius (° C.) to increase the compressive stress in the hard mask material; and subsequent to forming the material having the lower RI over the hard mask material, implanting C atoms through the lower RI material and into the hard mask material to reduce a compressive stress in the hard mask material.

2. The method of claim 1, further comprising forming the dielectric material from a silicon nitride material.

3. The method of claim 1, further comprising forming the hard mask material from substantially pure carbon.

4. The method of claim 1, further comprising forming the lower RI material from nitrous oxide ($N_2O$) plasma at a temperature in a range of from 350 degrees Celsius (° C.) to 450° C.

5. The method of claim 1, further comprising forming the lower RI material from nitrous oxide ($N_2O$) and silane ($SiH_4$) at a temperature in a range of from 350 degrees Celsius (° C.) to 450° C.

6. The method of claim 1, further comprising:
increasing the compressive stress in the hard mask material to at least 150 megapascals (MPa) by formation of the lower RI material over the hard mask material; and
subsequently reducing the increased compressive stress in the hard mask material to below 25 MPa by the C atoms being implanted into the hard mask material.

7. The method of claim 1, further comprising:
forming a pillar of a semiconductor device from the lower RI material, the hard mask material, and the dielectric material; and
wherein implanting the atoms through the lower RI material and into the hard mask material reduces the compressive stress in the hard mask material and reduces a probability of an unintended bend of the pillar;
wherein the reduced probability is relative to the C atoms being implanted into the hard mask material prior to formation of the lower RI material over the hard mask material.

8. The method of claim 1, further comprising:
implanting the C atoms into the hard mask material at:
a dose in a range of from $1 \times 10^{15}$ per square centimeter ($/cm^2$) to $1 \times 10^{16}/cm^2$; and
an implant energy in a range of from 5 kiloelectron volts (keV) to 60 keV.

* * * * *